(12) United States Patent
Suzuki et al.

(10) Patent No.: US 10,262,729 B2
(45) Date of Patent: Apr. 16, 2019

(54) STORAGE DEVICE AND CONTROL METHOD THEREOF

(71) Applicant: TOSHIBA MEMORY CORPORATION, Minato-ku, Tokyo (JP)

(72) Inventors: Kunifumi Suzuki, Yokkaichi Mie (JP); Kazuhiko Yamamoto, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/696,116

(22) Filed: Sep. 5, 2017

(65) Prior Publication Data

US 2018/0277203 A1    Sep. 27, 2018

(30) Foreign Application Priority Data

Mar. 24, 2017    (JP) .................................. 2017-060010

(51) Int. Cl.
*G11C 13/00*    (2006.01)
*H01L 27/24*    (2006.01)
*H01L 45/00*    (2006.01)

(52) U.S. Cl.
CPC ...... *G11C 13/0004* (2013.01); *G11C 13/0061* (2013.01); *G11C 13/0064* (2013.01); *G11C 13/0069* (2013.01); *G11C 13/0097* (2013.01); *H01L 27/2463* (2013.01); *H01L 45/06* (2013.01); *H01L 45/1233* (2013.01); *H01L 45/144* (2013.01); *G11C 2013/009* (2013.01); *G11C 2013/0066* (2013.01); *G11C 2013/0092* (2013.01)

(58) Field of Classification Search
CPC ............ G11C 13/0004; G11C 13/0069; G11C 13/0097; H01L 27/2463; H01L 45/06; H01L 45/1233; H01L 45/144
See application file for complete search history.

(56) References Cited

U.S. PATENT DOCUMENTS

| | | | |
|---|---|---|---|
| 7,796,426 B2 | 9/2010 | Tonomura et al. | |
| 7,939,365 B2* | 5/2011 | Kang .................. | G11C 13/0004 257/2 |
| 8,238,147 B2 | 8/2012 | Bae et al. | |
| 8,593,853 B2 | 11/2013 | Katoh | |
| 8,717,830 B2 | 5/2014 | Lym et al. | |
| 2012/0014164 A1* | 1/2012 | Kamoshida ........ | G11C 13/0004 365/148 |

* cited by examiner

*Primary Examiner* — Tri M Hoang
(74) *Attorney, Agent, or Firm* — Foley & Lardner LLP

(57) ABSTRACT

A storage device includes a first conductive layer, a second conductive layer, a first variable resistance layer, and a control circuit. The control circuit is configured to apply a first voltage between the first conductive layer and the second conductive layer for a first time and apply a second voltage less than the first voltage for a second time longer than the first time after the application of the first voltage when the first variable resistance layer is in a first high resistance state. The control circuit is further configured to apply the first voltage between the first conductive layer and the second conductive layer and apply a third voltage less than the second voltage between the first conductive layer and the second conductive layer after the application of the first voltage when the first variable resistance layer is in a first low resistance state.

16 Claims, 8 Drawing Sheets

STORAGE DEVICE AND CONTROL METHOD THEREOF

CROSS-REFERENCE TO RELATED APPLICATION

This application claims the benefit of and priority to Japanese Patent Application No. 2017-060010, filed Mar. 24, 2017, the entire contents of which are incorporated herein by reference.

Field

Embodiments described herein relate generally to a storage device and a control method thereof.

Background

Some resistive-random access memories transition between a high resistance state and a low resistance state by applying a current to variable resistance layers of memory cells. For example, when the high resistance state is defined as data "0" and the low resistance state is defined as data "1," the memory cells can store 1-bit data of "0" or "1." To realize acceleration of an operation of the resistive-random access memories, it may be beneficial to rewrite data of the memory cells in a short time.

DETAILED DESCRIPTION

Figure 1:
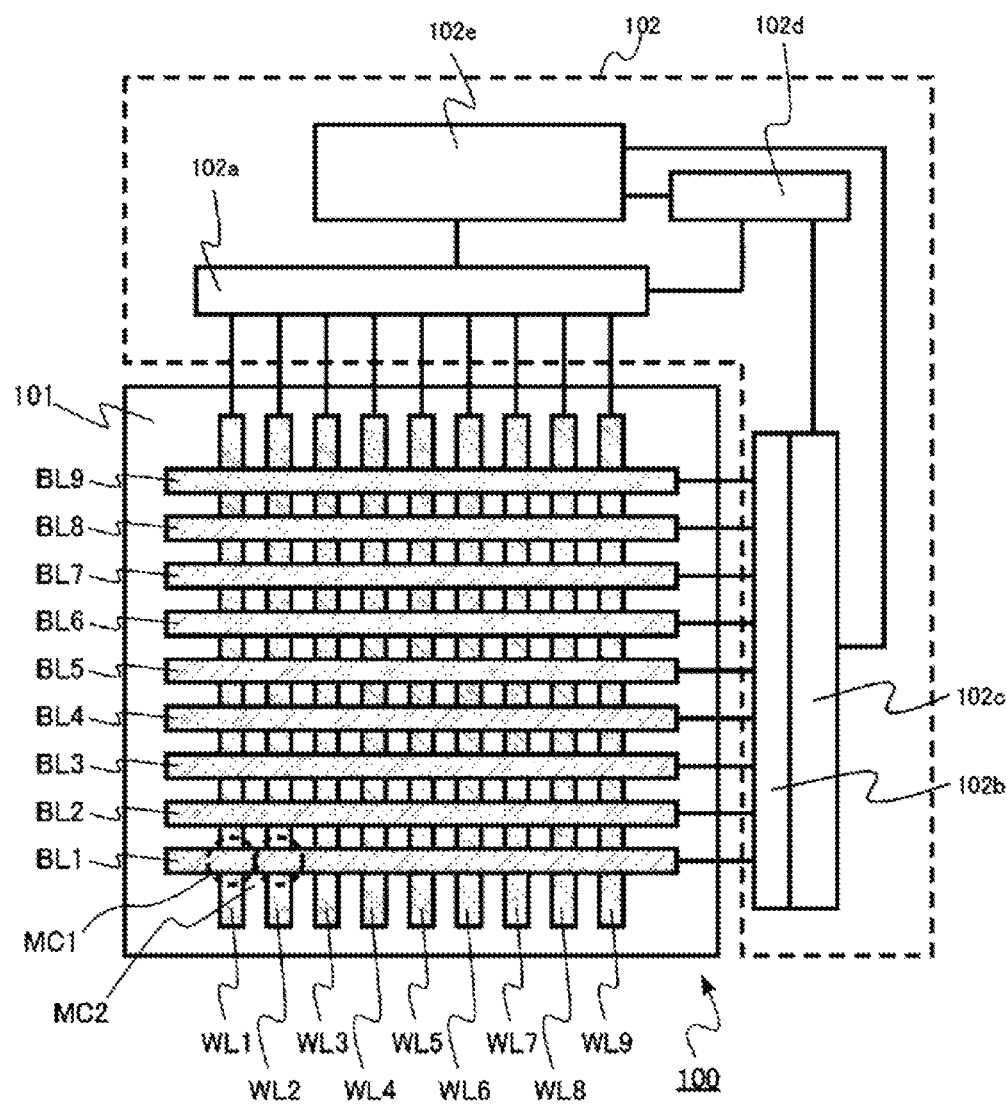
FIG. 1 is a block diagram illustrating a memory cell array and a peripheral circuit of one or more embodiments of a storage device according to a first aspect.

One or more example embodiments provide for a storage device capable of accelerating an operation.

In general, according to one or more embodiments, a storage device includes a first conductive layer extending in a first direction, a second conductive layer extending in a second direction intersecting the first direction, a first variable resistance layer provided between the first and second conductive layers and configured to assume a first high resistance state and a first low resistance state. The storage device further includes a control circuit configured to control a voltage to be applied to the first conductive layer and the second conductive layer. The control circuit is configured to apply a first voltage between the first conductive layer and the second conductive layer for a first time and to apply a second voltage less than the first voltage between the first conductive layer and the second conductive layer for a second time longer than the first time after the application of the first voltage when the first variable resistance layer is in the first high resistance state. The control circuit is further configured to apply the first voltage between the first conductive layer and the second conductive layer and to apply a third voltage less than the second voltage between the first conductive layer and the second conductive layer after the application of the first voltage when the first variable resistance layer is in the first low resistance state.

Hereinafter, one or more embodiments of the present disclosure will be described with reference to the drawings. In the following description, the same reference numerals are given to the same or similar components, and redundant descriptions of those components may be appropriately omitted.

Hereinafter, a storage device according to one or more embodiments will be described with reference to the drawings.

First Aspect

One or more embodiments of a storage device according to a first aspect includes a first conductive layer extending in a first direction, a third conductive layer extending in the first direction, a second conductive layer extending in a second direction intersecting the first direction, a first variable resistance layer provided between the first conductive layer and the second conductive layer and configured to assume a first high resistance state and to assume a second low resistance state, and a second variable resistance layer provided between the third conductive layer and the second conductive layer and configured to assume a second high resistance state and to assume a second low resistance state. The storage device further includes a control circuit configured to control voltages to be applied to the first conductive layer, the second conductive layer, and the third conductive layer. The control circuit is configured to apply a first voltage between the first conductive layer and the second conductive layer for a first time and to apply a second voltage less than the first voltage between the first conductive layer and the second conductive layer for a second time longer than the first time after the application of the first voltage when the first variable resistance layer is in the first high resistance state, and to apply the first voltage between the first conductive layer and the second conductive layer and to apply a third voltage less than the second voltage between the first conductive layer and the second conductive layer after the application of the first voltage when the first variable resistance layer is in the first low resistance state.

One or more embodiments of a method of controlling a storage device according to the first aspect includes providing a storage device including a first conductive layer extending in a first direction, a third conductive layer extending in the first direction, a second conductive layer extending in a second direction intersecting the first direction, a first variable resistance layer provided between the first conductive layer and the second conductive layer and configured to assume a first high resistance state and to assume a second low resistance state, and a second variable resistance layer provided between the third and second conductive layers and configured to assume a second high resistance state and to assume a second low resistance state. A first voltage is applied between the first conductive layer and the second conductive layer for a first time and a second voltage less than the first voltage is applied between the first conductive layer and the second conductive layer for a second time longer than the first time after the application of the first voltage when the first variable resistance layer is in the first high resistance state. The first voltage is applied between the first conductive layer and the second conductive layer and a third voltage less than the second voltage is applied between the first conductive layer and the second conductive layer after the application of the first voltage when the first variable resistance layer is in the first low resistance state.

Figure 2A:
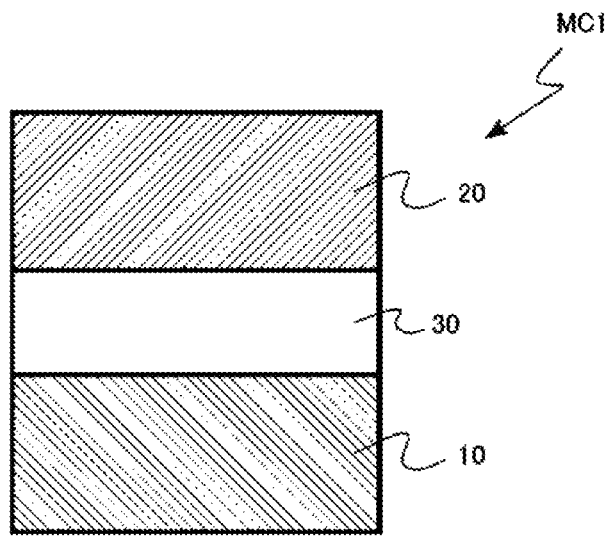
FIG. 2A and FIG. 2B are schematic sectional views illustrating a memory cell of one or more embodiments of a storage device according to the first aspect.
Figure 2B:
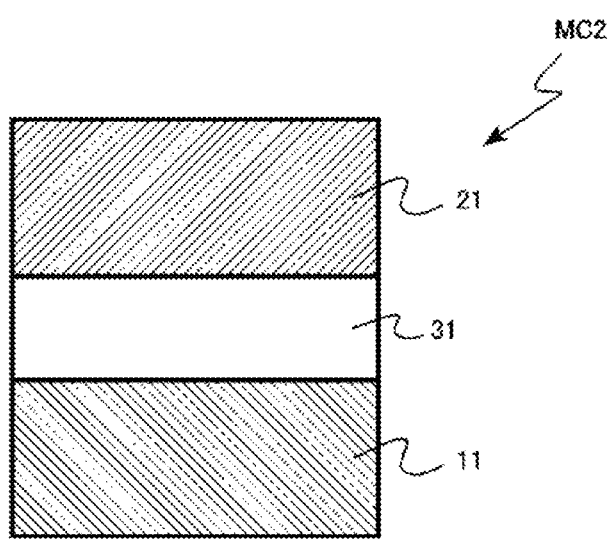

FIG. 1 is a block diagram illustrating a memory cell array and a peripheral circuit of a storage device according to the first aspect. FIG. 2A and FIG. 2B are schematic sectional views illustrating a memory cell of the storage device according to the first aspect. FIG. 2A illustrates a cross-section of a memory cell MC1 indicated by a dotted circle in the memory cell array of FIG. 1. FIG. 2B illustrates a cross-section of a memory cell MC2 indicated by a dotted circle in the memory cell array of FIG. 1.

A memory cell array 100 of a storage device according to the first aspect includes a plurality of word lines WL1, WL2, WL3, WL4, WL5, WL6, WL7, WL8, and WL9 (WL1 to WL9) extending in a first direction and a plurality of bit lines BL1, BL2, BL3, BL4, BL5, BL6, BL7, BL8, and BL9 (BL1 to BL9) extending in a second direction intersecting the first direction. The plurality of word lines WL1 to WL9 and the plurality of bit lines BL1 to BL9 are orthogonal to each other, for example.

The plurality of word lines WL1 to WL9 and the plurality of bit lines BL1 to BL9 are provided, for example, via insulating layers above a semiconductor substrate 101. For example, the bit lines BL1 to BL9 are provided on an upper layer or upper surfaces of the word lines WL1 to WL9.

A peripheral circuit 102 (e.g. a control circuit) is provided at a periphery of the memory cell array 100. The peripheral circuit 102 includes, for example, a word line decoder circuit 102a, a sense amplifier 102b, a bit line decoder circuit 102c, a driver circuit 102d, and a central control circuit 102e. The peripheral circuit 102 need not be disposed at the periphery of the memory cell array 100. For example, at least a portion of the peripheral circuit 102 may be disposed above or below the memory cell array 100 (e.g. substantially the entire peripheral circuit 102 may be disposed above or below the memory cell array 100).

A plurality of memory cells are provided at regions in which the word lines WL1 to WL9 and the bit lines BL1 to BL9 intersect each other. One or more embodiments of the storage device according to the first aspect is a resistive-random access memory that has a crosspoint structure. One or more embodiments of the storage device according to the first aspect has a 2-dimensional structure. The memory cells are 2-terminal variable resistance elements. One or more embodiments of the storage device according to the first aspect is a so-called phase change memory.

The plurality of word lines WL1 to WL9 are each connected to the word line decoder circuit 102a. The plurality of bit lines BL1 to BL9 are each connected to the sense amplifier 102b and the bit line decoder circuit 102c. The driver circuit 102d is connected to the word line decoder circuit 102a and the bit line decoder circuit 102c. The central control circuit 102e is connected to the word line decoder circuit 102a, the bit line decoder circuit 102c, and the driver circuit 102d.

The word line decoder circuit 102a and the bit line decoder circuit 102c have, for example, functions of selecting desired memory cells, rewriting data of the memory cells, and reading data of the memory cells. At the time of reading the data, the data of the memory cells are read based on, for example, amounts of currents flowing between the word lines WL1 to WL9 and the bit lines BL1 to BL9.

The sense amplifier 102b has, for example, a function of amplifying currents flowing in the bit lines BL1 to BL9. For example, the sense amplifier 102b has a function of determining a polarity of data from the amplified current. For example, whether the data is a "0" or a "1" is determined.

The driver circuit 102d has a function of generating voltages to be applied to the word lines WL1 to WL9 and the bit lines BL1 to BL9.

The central control circuit 102e has a function of generally controlling an operation of the peripheral circuit 102. For example, the central control circuit 102e has a function of controlling magnitudes or timings of the voltages to be applied to the word lines WL1 to WL9 and the bit lines BL1 to BL9.

The word line decoder circuit 102a, the sense amplifier 102b, the bit line decoder circuit 102c, the driver circuit 102d, and the central control circuit 102e are configured with, for example, electronic circuits using semiconductor devices formed on the semiconductor substrate 101. The semiconductor devices include, for example, transistors, diodes, or capacitors.

As illustrated in FIG. 2A, the memory cell MC1 includes a lower electrode 10, an upper electrode 20, and a variable resistance layer 30 (a first variable resistance layer).

The lower electrode 10 is, for example, a part of the word line WL (a first conductive layer). The lower electrode 10 includes, for example, a metal. The lower electrode 10 includes, for example, a titanium nitride (TiN) or tungsten (W).

The upper electrode 20 is, for example, a part of the bit line BL1 (a second conductive layer). The upper electrode 20 includes, for example, a metal. The upper electrode 20 includes, for example, a titanium nitride or tungsten.

The variable resistance layer 30 is interposed between the lower electrode 10 and the upper electrode 20. The variable resistance layer 30 is provided between the word line WL1 (the first conductive layer) and the bit line BL1 (the second conductive layer).

The variable resistance layer 30 can assume at least two different resistance states, a first high resistance state and a first low resistance state, and can switch between the at least two states based on an applied voltage.

The variable resistance layer 30 includes, for example, a chalcogenide. The variable resistance layer 30 is, for example, a chalcogenide including germanium (Ge), antimony (Sb), and tellurium (Te). The variable resistance layer 30 is, for example, a $Ge_2Sb_2Te_5$ alloy.

A film thickness of the variable resistance layer 30 is, for example, equal to or greater than about 5 nanometers (nm) and/or equal to or less than about 25 nm. The variable resistance layer 30 is, for example, a film formed by an atomic layer deposition method (ALD method).

As illustrated in FIG. 2B, the memory cell MC2 includes a lower electrode 11, an upper electrode 21, and a variable resistance layer 31 (a second variable resistance layer).

The lower electrode 11 is, for example, a part of the word line WL2. The upper electrode 21 is, for example, a part of the bit line BL1.

The variable resistance layer 31 is interposed between the lower electrode 11 and the upper electrode 21. The variable resistance layer 31 is provided between the word line WL2 (a third conductive layer) and the bit line BL1 (the second conductive layer).

The variable resistance layer 31 can assume at least two different resistance states, a second high resistance state and a second resistance state, and can switch between the at least two states based on an applied voltage. The same or similar materials and structures as those of the lower electrode 10, the upper electrode 20, and the variable resistance layer 30 can be implemented for the lower electrode 11, the upper electrode 21, and the variable resistance layer 31. The variable resistance layers 30 and 31 maybe continuous.

By applying a voltage to the variable resistance layer 30 of the memory cell MC1, the variable resistance layer 30 changes from a high resistance state to a low resistance state or from the low resistance state to the high resistance state. For example, the high resistance state is defined as data "0" and the low resistance state is defined as data "1." The memory cell MC1 can store 1-bit data of "0" or "1."

The change from the high resistance state to the low resistance state is referred to as a set operation and the change from the low resistance state to the high resistance state is referred to as a reset operation. The data of the memory cell can be rewritten through the set operation and the reset operation.

For example, a crystalline state of the variable resistance layer 30 is changed using Joule heating by applying a voltage. For example, the variable resistance layer 30 is in the high resistance state when in an amorphous phase. The variable resistance layer 30 is in the low resistance state when in a polycrystalline phase.

For example, when the variable resistance layer 30 is in the high resistance state, the voltage is applied to the variable resistance layer 30 by Joule heating, and subsequently the variable resistance layer 30 is crystallized by slow cooling to be changed from the amorphous phase to the polycrystalline phase. Accordingly, the variable resistance layer 30 enters a low resistance state. This operation is the set operation.

On the other hand, when the variable resistance layer 30 is in the low resistance state, the voltage is applied to the variable resistance layer 30 by Joule heating, and subsequently the variable resistance layer 30 becomes amorphous by rapid cooling to be changed from the polycrystalline phase to the amorphous phase. Accordingly, the variable resistance layer 30 enters a high resistance state. This operation is the reset operation.

The set operation and the reset operation can be realized by applying voltages with a same polarity. One or more embodiments of the storage device according to the first aspect are a unipolar device capable of rewriting data with voltages having a same polarity.

Next, a function of the peripheral circuit 102 and a control method using the peripheral circuit 102 will be described.

Figure 3A:
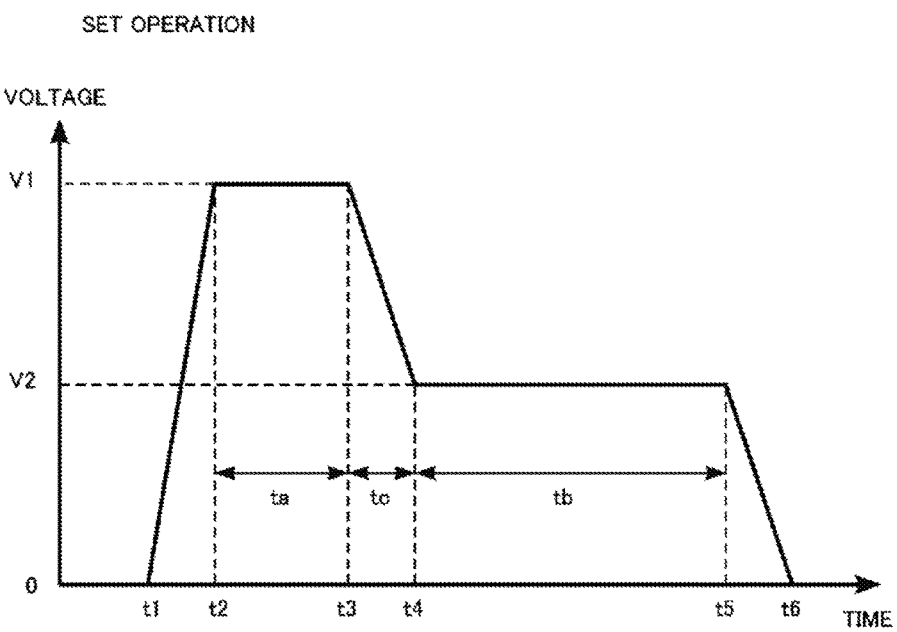
FIG. 3A and FIG. 3B are explanatory diagrams illustrating one or more embodiments of a method of controlling a storage device according to the first aspect.
Figure 3B:
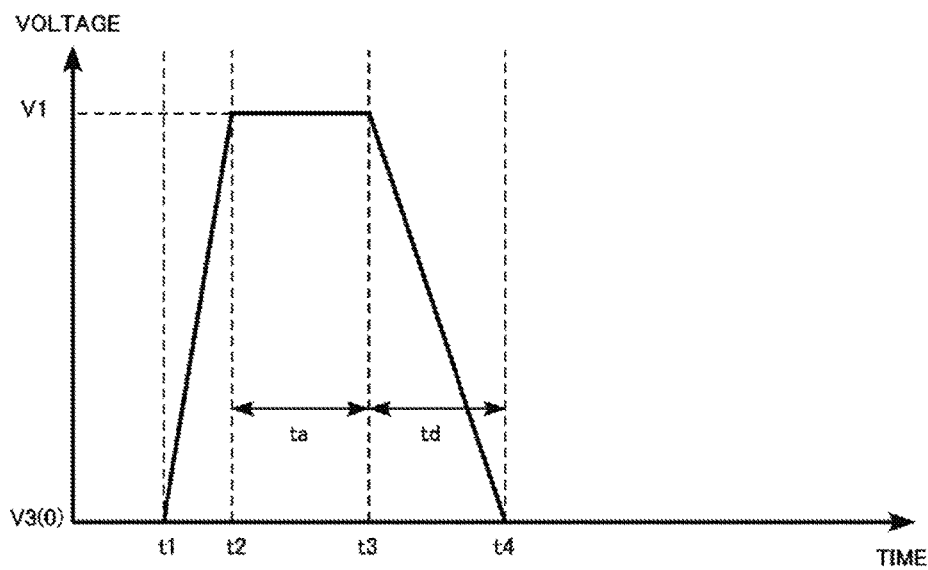

FIG. 3A and FIG. 3B are explanatory diagrams illustrating a method of controlling the storage device according to the first aspect. FIG. 3A is a diagram illustrating a voltage application method at the time of the set operation. FIG. 3B is a diagram illustrating a voltage application method at the time of the reset operation.

Examples of the set operation and the reset operation performed on the memory cell MC1 connected to the word line WL1 and the bit line BL1 will be described with reference to FIG. 3A and FIG. 3B.

In FIG. 3A and FIG. 3B, the horizontal axis represents a time and the vertical axis represents a voltage applied between the word line WL1 and the bit line BL1. The vertical axis represents a difference between a voltage applied to the word line WL1 and a voltage applied to the bit line BL1. Hereinafter, this difference is referred to as an interline voltage.

First, a set operation will be described with reference to FIG. 3A. Before the set operation starts, the variable resistance layer 30 is in the high resistance state. The variable resistance layer 30 is in the amorphous phase in the high resistance state.

The interline voltage starts increasing from about 0 V at time t1 and reaches a first voltage (V1) at time t2. The first voltage (V1) is applied for a first time (ta) to time t3. The interline voltage drops from the first voltage (V1) to a second voltage (V2) over a third time (tc) from time t3 to time t4. Thereafter, the second voltage (V2) is applied for a second time (tb) to time t5. The second time (tb) is longer than the first time (ta). Thereafter, for example, the interline voltage drops to about zero (e.g. starts dropping at time t5 and reaches about 0 V at a time t6).

The first time (ta), that is, a time during which the interline voltage is maintained at the first voltage (V1), is, for example, equal to or longer than about 10 nanoseconds and/or equal to or shorter than about 50 nanoseconds. The second time (tb), that is, a time during which the interline voltage is maintained at the second voltage (V2), is, for example, equal to or longer than about 70 nanoseconds and/or equal to or shorter than about 500 nanoseconds. The third time (tc), that is, a time over which the interline voltage is changed from the first voltage (V1) to the second voltage (V2), is, for example, equal to or longer than about 5 nanoseconds and/or equal to or shorter than about 30 nanoseconds.

The second time (tb) is longer than the first time (ta). In one or more embodiments, the second time (tb) is longer than the third time (tc). In one or more embodiments, the first time (ta) is shorter than the third time (tc).

The first voltage (V1) is, for example, equal to or greater than about 1 V and/or equal to or less than about 3 V. The second voltage (V2) is equal to or greater than about 0.3 V and/or equal to or less than about 2 V. For example, the magnitude of the second voltage (V2) is equal to or greater than about one-third of the magnitude of the first voltage (V1) and/or equal to or less than about two-thirds of the magnitude of the first voltage (V1).

The variable resistance layer 30 is in the amorphous phase in the initial state. For the first time (ta) in which the interline voltage is maintained at the first voltage (V1), the variable resistance layer 30 is heated by Joule heating. Thereafter, for the second time (tb) in which the interline voltage is maintained at the second voltage (V2), the variable resistance layer 30 is slowly cooled. Meanwhile, the variable resistance layer 30 is crystallized to be in the polycrystalline phase. When the variable resistance layer 30 is in the polycrystalline phase, the variable resistance layer 30 enters the low resistance state.

Next, a reset operation will be described with reference to FIG. 3B. Before the reset operation starts, the variable resistance layer 30 is in the low resistance state. The variable resistance layer 30 is in the polycrystalline phase in the low resistance state.

The interline voltage starts increasing from about zero at time t1 and reaches the first voltage (V1) at time t2. For the first time (ta) to time t3, the first voltage (V1) is applied. During a fourth time (td) from time t3 to time t4, the interline voltage drops from the first voltage (V1) to the third voltage (V3).

The third voltage (V3) is less than the second voltage (V2). The third voltage (V3) is, for example, about 0 V.

The first time (ta), that is, a time during which the interline voltage is maintained at the first voltage (V1), is, for example, equal to or longer than about 10 nanoseconds and/or equal to or shorter than about 50 nanoseconds. The fourth time (td), that is, a time during which the interline voltage is changed from the first voltage (V1) to the third voltage (V3), is, for example, equal to or longer than about 5 nanoseconds and/or equal to or shorter than about 30 nanoseconds.

For example, the first time (ta) is shorter than the fourth time (td).

The variable resistance layer 30 is in the polycrystalline phase in the initial state. For the first time (ta) in which the interline voltage is maintained at the first voltage (V1), the variable resistance layer 30 is heated by Joule heating. Thereafter, for the fourth time (td) during which the interline voltage drops to the third voltage (V3), the variable resistance layer 30 is rapidly cooled. Meanwhile, the variable resistance layer 30 becomes amorphous to be in the amorphous phase. When the variable resistance layer 30 is in the amorphous phase, the variable resistance layer 30 enters the high resistance state.

Figure 4:
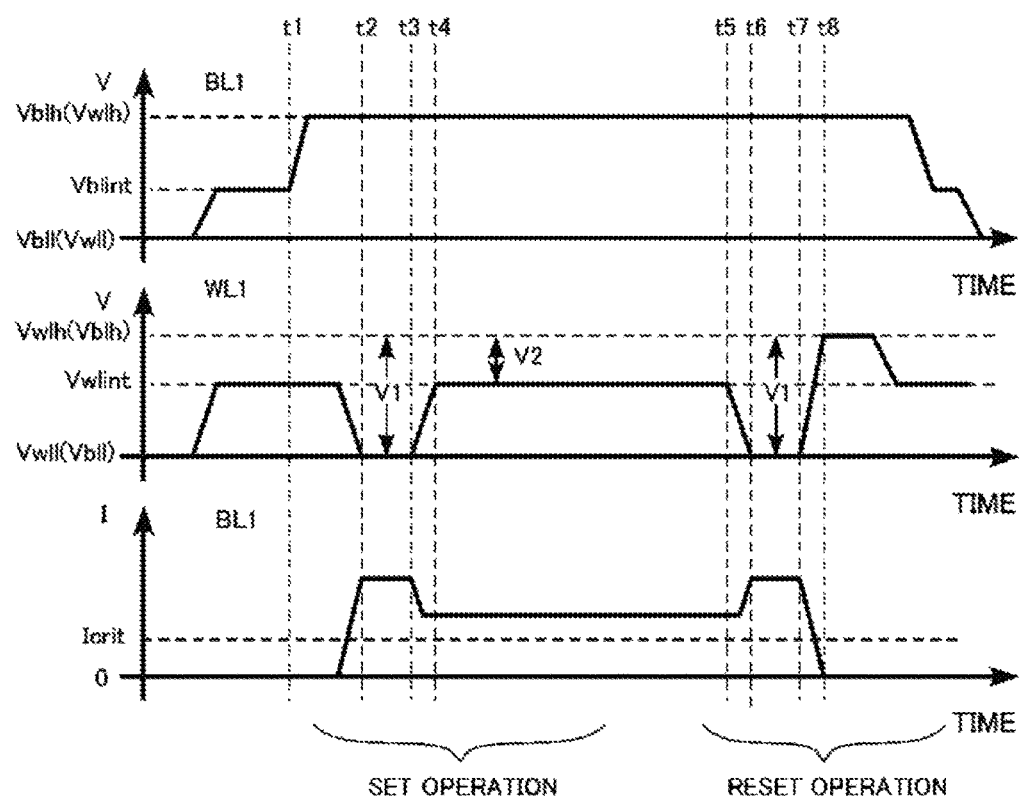
FIG. 4 is an explanatory diagram illustrating one or more embodiments of a method of controlling a storage device according to the first aspect.

FIG. 4 is an explanatory diagram illustrating one or more embodiments of a method of controlling the storage device according to the first aspect. FIG. 4 is a timing chart illustrating voltages applied to the bit line BL1 and the word line WL1.

FIG. 4 is the timing chart illustrating the set operation and the reset operation of the memory cell MC1 between the word line WL1 and the bit line BL1. A voltage applied to the bit line BL1, a voltage applied to the word line WL1, and a current flowing in the bit line BL1 are illustrated in order from the upper side of FIG. 4.

Voltage levels applied to the bit line BL1 are a BL high level (Vblh), a BL intermediate level (Vblint), and a BL low level (VBll). The magnitudes of the voltage levels satisfy Vblh>Vblint>Vbll.

Voltage levels applied to the word line WL1 are a WL high level (Vwlh), a WL intermediate level (Vwlint), and a WL low level (Vwll). The magnitudes of the voltage levels satisfy Vwlh>Vwlint>Vwll.

Hereinafter, to facilitate the description, the magnitudes of the BL high level (Vblh) and the WL high level (Vwlh) are assumed to be substantially the same. However, in other embodiments these voltages may differ. The magnitudes of the BL low level (Vbll) and the WL low level (Vwll) are assumed to be substantially the same. However, in other embodiments these voltages may differ. The BL low level (Vbll) and the WL low level (Vwll) are assumed to be substantially the same, for example, about 0 V. However, in other embodiments these voltages may differ.

During the set operation, from time t2 to time t3, the BL high level (Vblh) is applied to BL1 and the WL low level (Vwll) is applied to WL1. Meanwhile, the first voltage (V1) which is a difference between the BL high level (Vblh) and the WL low level (Vwll) is applied as the interline voltage to the variable resistance layer 30. Thereafter, from time t4 to time t5, the BL high level (Vblh) is applied to BL1 and the WL intermediate level (Vwlint) is applied to WL1. Meanwhile, the second voltage (V2) which is a difference between the BL high level (Vblh) and the WL intermediate level (Vwlint) is applied as the interline voltage to the variable resistance layer 30. Through the set operation, a current flowing in the bit line BL1 is equal to or greater than a reference current (e.g. a critical current "Icrit").

During the reset operation, from time t6 to time t7, the BL high level (Vblh) is applied to BL1 and the WL low level (Vwll) is applied to WL1. Meanwhile, the first voltage (V1) which is a difference between the BL high level (Vblh) and the WL low level (Vwll) is applied as the interline voltage to the variable resistance layer 30. Thereafter, from time t7 to time t8, the level of WL1 is changed to the WL high level (Vwlh). The third voltage (V3) which is a difference between the BL high level (Vblh) and the WL high level (Vwlh) is applied as the interline voltage to the variable resistance layer 30. When the BL high level (Vblh) and the WL high level (Vwlh) are the same, the third voltage (V3) is about 0 V. Through the reset operation, a current flowing in the bit line BL1 is equal to or less than the reference current (Icrit).

The peripheral circuit 102 is configured to perform the set operation and the reset operation. The reset operation is controlled using the peripheral circuit 102.

Hereinafter, operational effects of the first aspect will be described.

To improve a storage device for some implementations, an operation of rewriting data of a memory cell of the storage device can be performed at a high speed.

In a phase-change memory, a crystalline state is changed using Joule heating generated in a variable resistance layer by applying a voltage. Because this may involve crystallizing the variable resistance layer by slow cooling, it can be challenging for some comparative devices to accelerate the rewriting operation.

Figure 5A:
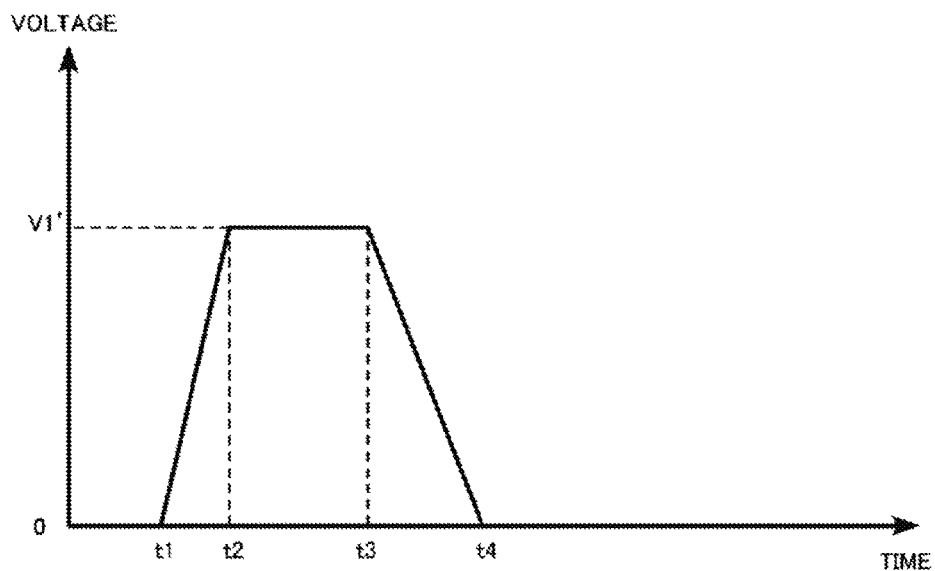
FIG. 5A and FIG. 5B are explanatory diagrams illustrating operational effects of a storage device according to a first comparative example.
Figure 5B:
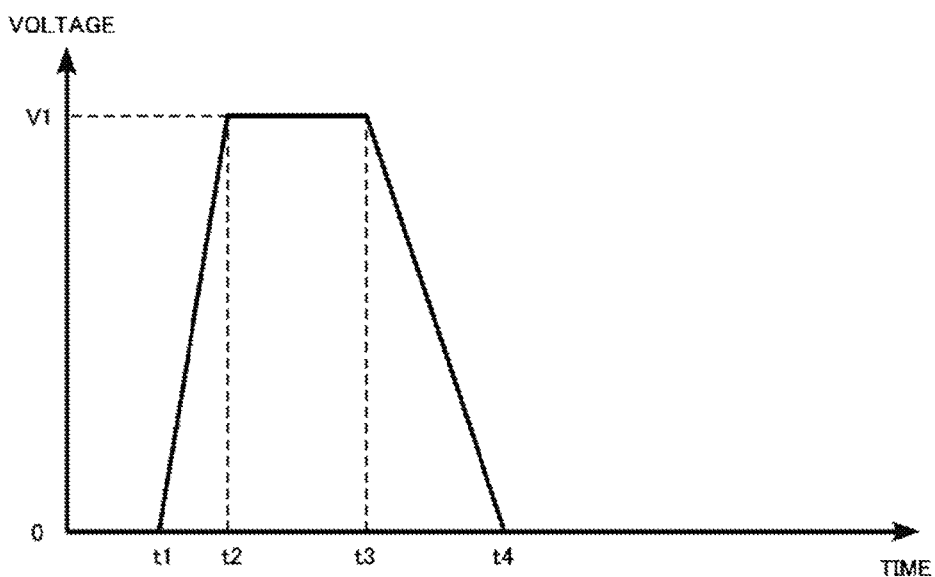

FIG. 5A and FIG. 5B are explanatory diagrams illustrating operational effects of the storage device according to a first comparative example. FIG. 5A and FIG. 5B are explanatory diagrams illustrating a method of controlling a storage device according to the first comparative example. FIG. 5A is a diagram illustrating a voltage application method for a set operation. FIG. 5B is a diagram illustrating a voltage application method for a reset operation.

Examples of the set operation and the reset operation on the memory cell connected to a word line and a bit line will be described with reference to FIG. 5A and FIG. 5B.

In the case of the first comparative example, magnitudes of the interline voltages from time t2 to time t3 differ depending on whether the set operation or the reset operation is being performed. A voltage V1' for the set operation is set to a voltage lower than the voltage V1 for the reset operation.

In the case of the first comparative example, a difference in a change of the crystalline state of a variable resistance layer is caused by a difference in the magnitude of the interline voltage. Therefore, a margin between the voltage of the set operation and the reset operation considerably decreases and erroneous rewriting may readily occur. To remedy this, a frequency of a data verification operation may be raised, and thus it may be difficult to accelerate the storage device.

Figure 6A:
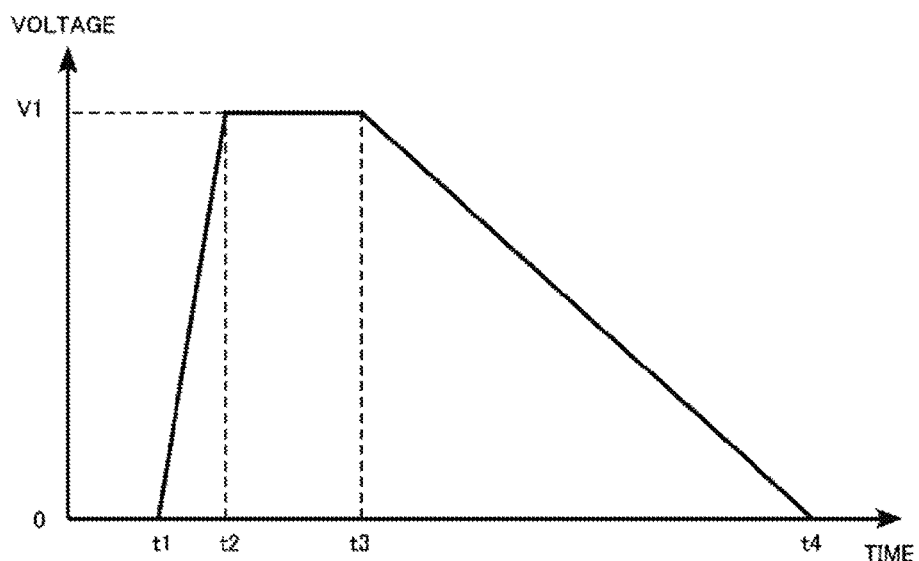
FIG. 6A and FIG. 6B are explanatory diagrams illustrating operational effects of a storage device according to a second comparative example.
Figure 6B:
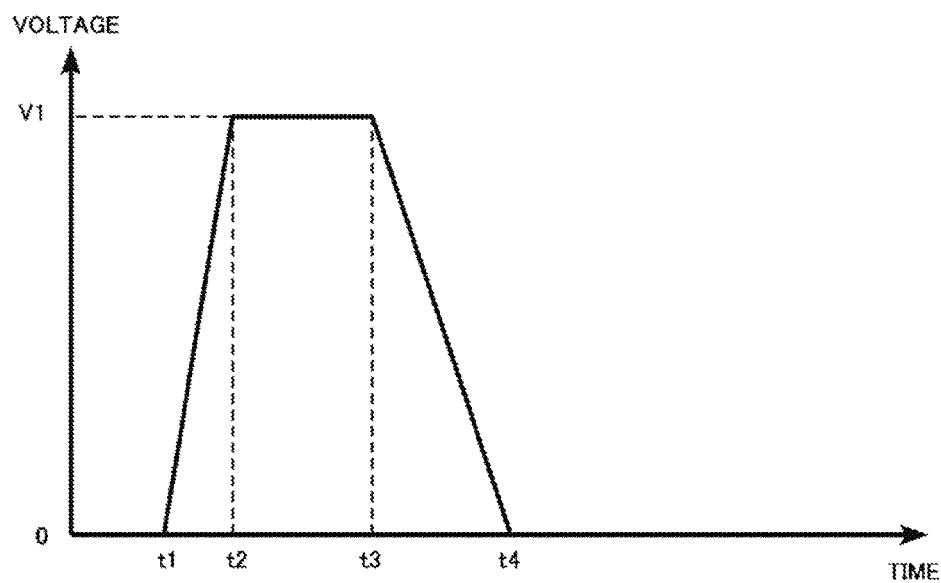

FIG. 6A and FIG. 6B are explanatory diagrams illustrating operational effects of a storage device according to a second comparative example. FIG. 6A and FIG. 6B are explanatory diagrams illustrating a method of controlling a storage device according to the second comparative example. FIG. 6A is a diagram illustrating a voltage application method for a set operation. FIG. 6B is a diagram illustrating a voltage application method for a reset operation.

Examples of the set operation and the reset operation on the memory cell connected to a word line and a bit line will be described with reference to FIG. 6A and FIG. 6B.

In the case of the second comparative example, a magnitude of the interline voltage applied from time t2 to time t3 is the same for the set operation and for the reset operation. In the second comparative example, a drop time, that is, a time from time t3 to time t4, is set to be longer in the case of the set operation than in the case of the reset operation. By setting the drop time in the case of the set operation to be longer, the variable resistance layer is slowly cooled and the variable resistance layer is crystallized.

In the case of the second comparative example, a waveform pattern in which the drop time is a short time and a waveform pattern in which the drop time is a long time may be implemented. The waveform pattern in which the drop time is long is realized, for example, by adding a waveform formation circuit of a word line with large coupling capacitance. In this case, it may take some time to charge or discharge the added waveform formation circuit, and thus it can be challenging to accelerate the storage device. Further, since a time for charging or discharging increases due to the influence of the capacitance caused from the added waveform formation circuit increases, the drop time (a time from t3 to t4 in FIG. 6B) of the reset operation increases, and thus a reset failure may occur.

A storage device according to the first aspect uses two voltages, the first voltage (V1) and the second voltage (V2) lower than the first voltage (V1), as the interline voltages applied between the word line and the bit line. During the set operation, by applying the second voltage (V2) subsequent to the first voltage (V1), the variable resistance layer is slowly cooled and the variable resistance layer is crystallized. On the other hand, by applying about 0 V without passing the second voltage (V2) from the first voltage (V1) during the reset operation, the variable resistance layer is rapidly cooled and the variable resistance layer becomes amorphous.

The storage device according to the first aspect can set a margin of the voltages of the set operation and the reset operation to be greater than that of the first comparative example. Accordingly, the frequency of the verification operation can be lowered and the storage device can be readily accelerated.

In the storage device according to the first aspect, the drop waveform of the first voltage (V1) may be steep in both the case of the set operation and the case of the reset operation. Accordingly, a drop time at the time of the set operation is not necessarily set to be long and the added waveform formation circuit is provided. Accordingly, a time for charging or discharging of the waveform formation circuit need not be increased and the storage device can be readily accelerated.

According to the first aspect, the first time (ta), that is, the time during which the interline voltage is maintained at the first voltage (V1) can be equal to or longer than about 10 nanoseconds and/or equal to or shorter than about 50 nanoseconds. When the time is shorter than this range, the variable resistance layer 30 may not be sufficiently heated and there is a risk of erroneous rewriting occurring. Conversely, when the time is longer than this range, the time to rewrite data may be long and acceleration of the storage device may be challenging.

The second time (tb), that is, the time during which the interline voltage is maintained at the second voltage (V2), can be, for example, equal to or longer than about 70 nanoseconds and/or equal to or shorter than about 500 nanoseconds. When the time is shorter than this range, cooling of the variable resistance layer 30 at the time of the set operation is rapid and there is a risk of erroneous rewriting occurring. Conversely, when the time is longer than this range, the time to rewrite data may be long and acceleration of the storage device may be challenging.

The third time (tc), that is, a change time from the first voltage (V1) to the second voltage (V2), and the fourth time (td), that is, a change time from the first voltage (V1) to the third voltage (V3), can be equal to or longer than about 5 nanoseconds and/or equal to or shorter than about 30 nanoseconds. It can be challenging to realize a waveform formation circuit in which the times are shorter than are provided for in this range. When the times are longer than this range, the cooling of the variable resistance layer 30 at the time of the reset operation is considerably delayed and there is a risk of erroneous rewriting occurring.

The first voltage (V1) can be equal to or greater than about 1 V and/or equal to or less than about 3 V. When the voltage is less than this range, the variable resistance layer 30 may not be sufficiently heated and there is a risk of erroneous rewriting occurring. When the voltage is greater than this range, a current flowing in the variable resistance layer 30 is large and there is a risk of the storage device being broken down. In addition, there is a risk of power consumption of the storage device being large.

The second voltage (V2) can be equal to or greater than about 0.3 V and/or equal to or less than about 2 V. When the voltage is less than this range, the cooling of the variable resistance layer 30 at the time of the set operation is rapid and there is a risk of erroneous rewriting occurring. When the voltage is greater than this range, the variable resistance layer 30 is not slowly cooled and there is a risk of erroneous rewriting occurring.

The magnitude of the second voltage (V2) can be equal to or greater than about one-third and/or equal to or less than about two-thirds of the magnitude of the first voltage (V1). When the voltage is less than this range, the cooling of the variable resistance layer 30 at the time of the set operation is rapid and there is a risk of erroneous rewriting occurring. When the voltage is greater than this range, the variable resistance layer 30 is not slowly cooled and there is a risk of erroneous rewriting occurring.

As described above, according to the first aspect, by using two voltages, the first voltage (V1) and the second voltage (V2), as the interline voltage applied between the word line and the bit line, it is possible to realize acceleration of a storage device.

Second Aspect

One or more embodiments of a storage device according to a second aspect include a control circuit configured to compare a current flowing in a second conductive layer to a reference current (e.g. a predetermined reference current) while a second voltage is applied. The storage device according to the second aspect includes a control circuit configured to compare a current flowing in the second conductive layer to the reference current while the second voltage is applied, and to apply a first voltage between the first and second conductive layers for a first time, to apply the first voltage between the first and second conducive layers, and subsequently to apply a fourth voltage less than the first voltage and greater than the second voltage responsive to a determination that the current is less than the reference current.

A method of controlling the storage device according to the second aspect includes comparing the current flowing in the second conductive layer to the reference current while the second voltage is applied. The method of controlling the storage device according to the second aspect includes comparing the current flowing in the second conductive layer to the reference current while the second voltage is applied, and applying the first voltage between the first and second conductive layers for the first time, applying the first voltage between the first and second conductive layers, and subsequently applying the fourth voltage less than the first voltage and greater than the second voltage responsive to a determination that the current is less than the reference current.

Hereinafter, redundant description of components or operations similar to those according to the first aspect will be omitted.

Figure 7:
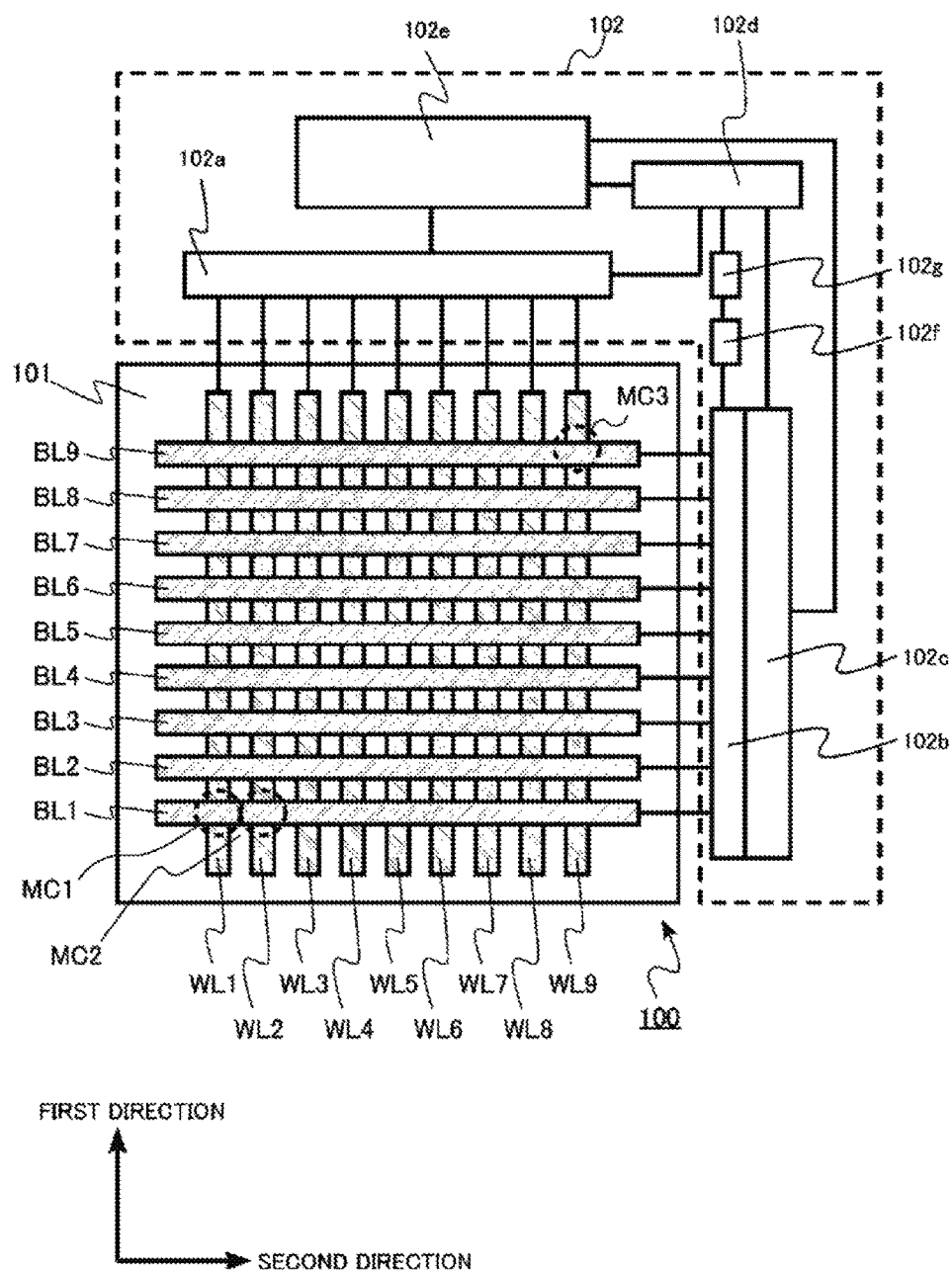
FIG. 7 is a block diagram illustrating a memory cell array and a peripheral circuit of one or more embodiments of a storage device according to a second aspect.

FIG. 7 is a block diagram illustrating a memory cell array and a peripheral circuit of one or more embodiments of a storage device according to the second aspect. A peripheral circuit 102 includes a word line decoder circuit 102a, a sense amplifier 102b, a bit line decoder circuit 102c, a driver circuit 102d, a central control circuit 102e, a determination circuit 102f, and a word line voltage adjustment circuit 102g.

The determination circuit 102f and the word line voltage adjustment circuit 102g are connected between, for example, the sense amplifier 102b and the driver circuit 102d.

Hereafter, examples of a set operation and a reset operation on the memory cell MC1 connected to the word line WL1 and the bit line BL1 will be described.

The determination circuit 102f is configured to compare a current flowing in the bit line BL1 to a reference current (Icrit) while the second voltage (V2) is applied as an interline voltage between the word line WL1 and the bit line BL1. The determination circuit 102f is configured to perform a verification operation of determining a polarity of data of the memory cell MC1 during the set operation on the memory cell MC1.

The word line voltage adjustment circuit 102g is configured to change the interline voltage during re-rewriting data to the fourth voltage (V4) greater than the second voltage (V2) responsive to a determination that the current flowing in the bit line BL1 is less than the reference current (Icrit) (e.g. as determined by the verification operation during the set operation).

Figure 8:
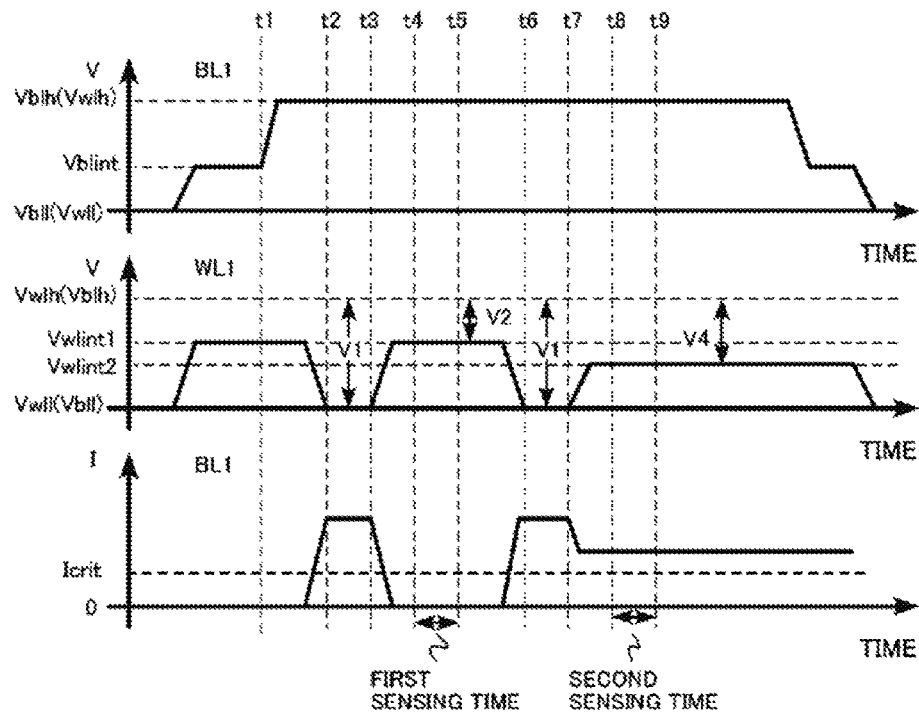
FIG. 8 is an explanatory diagram illustrating one or more embodiments of a method of controlling the storage device according to the second aspect.

FIG. 8 is an explanatory diagram illustrating one or more embodiments of a method of controlling the storage device according to the second aspect. FIG. 8 is a timing chart illustrating voltages applied to the bit line BL1 and the word line WL1.

FIG. 8 is a timing chart illustrating the set operation of the memory cell MC1 between the word line WL1 and the bit line BL1. A voltage applied to the bit line BL1, a voltage applied to the word line WL1, and a current flowing in the bit line BL1 are illustrated in order from the upper side of FIG. 8.

During the set operation, from time t2 to time t3, the BL high level (Vblh) is applied to BL1 and the WL low level (Vwll) is applied to WL1. Meanwhile, the first voltage (V1) which is a difference between the BL high level (Vblh) and the WL low level (Vwll) is applied as the interline voltage to the variable resistance layer 30. Thereafter, the BL high level (Vblh) is applied to BL1 and a first WL intermediate level (Vwlint1) is applied to WL1. Meanwhile, the second voltage (V2) which is a difference between the BL high level (Vblh) and the first WL intermediate level (Vwlint1) is applied as the interline voltage to the variable resistance layer 30.

From time t4 to time t5 (FIRST SENSING TIME), the current flowing in the bit line BL1 is compared to the reference current (Icrit). When it is determined that the current flowing in the bit line BL1 is greater than the reference current (Icrit), the set operation ends.

When it is determined that the current flowing in the bit line BL1 is less than the reference current (Icrit), the set operation is performed again. From time t6 to time t7, the first voltage (V1) is applied again as the interline voltage to the variable resistance layer 30. Thereafter, a second WL intermediate level (Vwlint2) is applied to WL1. The fourth voltage (V4) is applied as the interline voltage to the variable resistance layer 30.

By applying the first voltage (V1) and the fourth voltage (V4) to the variable resistance layer 30, the set operation on the memory cell MC1 is performed again.

The second WL intermediate level is a voltage lower than the first WL intermediate level. Accordingly, the fourth voltage (V4) is greater than the second voltage (V2). The fourth voltage (V4) is less than the first voltage (V1).

From time t8 to time t9 (SECOND SENSING TIME), the current flowing in the bit line BL1 is compared to the reference current (Icrit). When the current flowing in the bit line BL1 is determined to be greater than the reference current (Icrit), the set operation ends.

The peripheral circuit 102 is configured to perform the set operation. The set operation is controlled using the peripheral circuit 102.

The verification operation during the set operation is performed using, for example, the determination circuit 102f. The second WL intermediate level (Vwlint2) voltage is generated based on the verification operation during the set operation using, for example, the word line voltage adjustment circuit 102g and the driver circuit 102d.

The storage device according to the second aspect can perform the verification operation in parallel without waiting for ending of the set operation. Accordingly, it is possible to shorten a time necessary for the verification operation. Thus, it is possible to realize acceleration of the storage device.

The fourth voltage (V4) applied at the time of performing the set operation again is greater than the second voltage (V2) applied at the time of performing the set operation initially. By applying the fourth voltage (V4) greater than at the time of performing the set operation initially, the variable resistance layer 30 is readily changed to a low resistance state. Accordingly, the number of times of performing the verification operation for the memory cell is reduced and the time for the verification operation is reduced. Thus, it is possible to realize the acceleration of the storage device.

A configuration can also be applied in which a voltage applied during the set operation again (e.g. a second time) is set to a voltage which has the same magnitude of the second voltage (V2) applied at the time of performing the set operation initially. In this case, by performing the verification operation without waiting for ending of the set operation, it is possible to realize acceleration of the storage device.

For example, in the memory cell MC1 or MC2 located at a distant position from the peripheral circuit 102 including the driver circuit 102d, the word line decoder circuit 102a, and the bit line decoder circuit 102c in the block diagram of FIG. 7, a voltage drop due to wiring resistance or the like may increase. Therefore, there is risk of data rewriting being not executable at the time of the set operation without applying the interline voltage with a sufficient magnitude.

According to the second aspect, for example, a result of the verification operation on the memory cell MC1 or MC2 located at a distant position from the peripheral circuit 102 can be fed back and used to determine the magnitudes of the voltages (V2, V4, and the like) applied for crystallization after the application of the first voltage (V1). Therefore, voltage conditions for an improved set operation can be applied and can account for an influence of a voltage drop due to wiring resistance or the like, and thus it is possible to realize a stable set operation. Accordingly, the number of times of performing the verification operation on the memory cell is reduced and the time for the verification operation is reduced. Thus, it is possible to realize the acceleration of the storage device.

As described above, according to the second aspect, as with the first aspect, it is possible to realize acceleration of the storage device by using two voltages, the first voltage (V1) and the second voltage (V2), as the interline voltages applied between the word line and the bit line. By performing the verification operation during the set operation, it is possible to realize further acceleration of the storage device. By optimizing application voltages at the time of the set operation, the set operation is stabilized, and thus it is possible to realize further acceleration of the storage device.

Third Aspect

One or more embodiments of a storage device according to a third aspect is configured to apply the first voltage between the third and second conductive layers while the second voltage is applied between the first and second conductive layers. A method of controlling the storage device according to the third aspect includes applying the first voltage between the third and second conductive layers while the second voltage is applied between the first and second conductive layers. Hereinafter, redundant description of components or operations similar to those according to the first aspect will be omitted.

Figure 9:
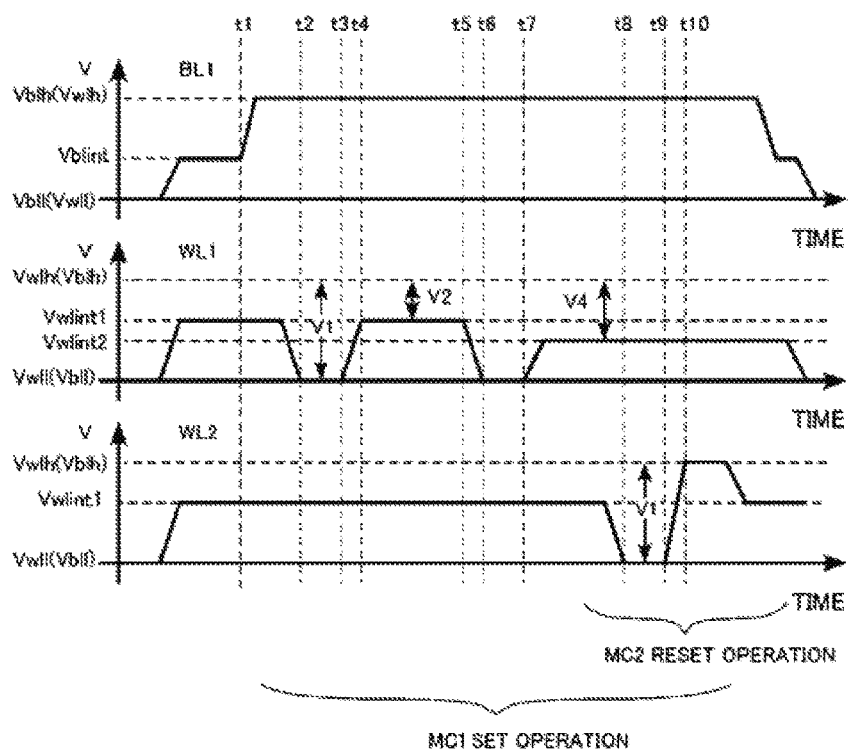
FIG. 9 is an explanatory diagram illustrating one or more embodiments of a method of controlling a storage device according to a third aspect.

FIG. 9 is an explanatory diagram illustrating one or more embodiments of a method of controlling the storage device according to the third aspect. FIG. 9 is a timing chart illustrating voltages applied to the bit line BL1 and the word line WL1.

FIG. 9 is a timing chart illustrating a set operation on the memory cell MC1 between a word line WL1 (a first conductive layer) and a bit line BL1 (a second conductive layer) and a set operation on the memory cell MC2 between a word line WL2 (a third conductive layer) and the bit line BL1 (the second conductive layer). A voltage applied to the bit line BL1, a voltage applied to the word line WL1, and a voltage applied to the word line WL2 are illustrated in order from the upper side of FIG. 9.

During the set operation on the memory cell MC1, from time t2 to time t3, the BL high level (Vblh) is applied to BL1 and the WL low level (Vwll) is applied to WL1. Meanwhile, the first voltage (V1) which is a difference between the BL high level (Vblh) and the WL low level (Vwll) is applied as the interline voltage to the variable resistance layer 30. Thereafter, from time t4 to time t5, the BL high level (Vblh) is applied to BL1 and the first WL intermediate level (Vwlint1) is applied to WL1. Meanwhile, the second voltage (V2) which is a difference between the BL high level (Vblh) and the first WL intermediate level (Vwlint1) is applied as the interline voltage to the variable resistance layer 30 of the memory cell MC1.

For example, when a verification operation on the memory cell MC1 is performed from time t4 to time t5 and rewriting is determined to be insufficient or to be erroneously performed, the set operation is performed again. From time t6 to time t7, the first voltage (V1) is applied. Thereafter, the fourth voltage (V4) higher than the second voltage (V2) is applied to the variable resistance layer 30.

From time t8 to time t9 in which the fourth voltage (V4) is applied to the variable resistance layer 30, the BL high level (Vblh) is applied to BL1 and the WL low level (Vwll) is applied to WL2 between the word line WL2 and the bit line BL1. Meanwhile, the first voltage (V1) which is a difference between the BL high level (Vblh) and the WL low level (Vwll) is applied as the interline voltage to a variable resistance layer 31 of the memory cell MC2.

Thereafter, from time t9 to time t10, the level of WL2 is changed to the WL high level (Vwlh). The third voltage (V3) which is a difference between the BL high level (Vblh) and the WL high level (Vwlh) is applied as the interline voltage to the variable resistance layer 31. When the BL high level (Vblh) and the WL high level (Vwlh) are the same, the third voltage (V3) is about 0 V. By performing operations including changing the interline voltage from the first voltage (V1) to about 0 V, the reset operation on the memory cell MC2 is performed.

The peripheral circuit 102 is configured to perform the set operation and the reset operation. The reset operation is controlled using the peripheral circuit 102.

According to the third aspect, the reset operation on the memory cell MC2 can be performed in parallel during the set operation of the memory cell MC1. Accordingly, it is possible to shorten a time for the reset operation on the memory cell MC2. Thus, it is possible to realize acceleration of the storage device.

The reset operation on the memory cell MC2 need not necessarily be performed during the set operation after the verification operation on the memory cell MC1. For example, the reset operation on the memory cell MC2 may be performed during the initial set operation on the memory cell MC1. For example, from time t4 to time t5 in FIG. 9, the reset operation on the memory cell MC2 may be performed. In this case, while the second voltage (V2) is applied to the variable resistance layer 30, the reset operation on the memory cell MC2 is performed.

An operation to be performed on the memory cell MC2 during the set operation on the memory cell MC1 may be the set operation.

As described above, according to the third aspect, as with the first aspect, it is possible to realize acceleration of the storage device by using two voltages, the first voltage (V1) and the second voltage (V2), as the interline voltages applied between the word line and the bit line. By performing the reset operation or the set operation on the memory cell MC2 during the set operation on the memory cell MC1, it is possible to realize further acceleration of the storage device.

In accordance with the first through third aspects, some examples in which the memory cell array has a 2-dimensional structure have been described, but the memory cell array can also be configured to have a 3-dimensional structure. By realizing the memory cell array that has the 3-dimensional structure, it is possible to obtain the advantage of improving an integration degree of the storage device in addition to the advantages of the first to third embodiments.

In one or more embodiments in accordance with the first through third aspects, the resistive-random access memory in which the crystalline state of the variable resistance layer is controlled using Joule heating has been described. However, for example, the present disclosure can be applied to another resistive-random access memory such as a resistive-random access memory in which composition distribution of the variable resistance layer is controlled using Joule heating.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

While certain embodiments have been described, these embodiments have been presented by way of example only, and are not intended to limit the scope of the present disclosure. Indeed, the embodiments described herein may be embodied in a variety of other forms and may be combined; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A storage device comprising:
a first conductive layer extending in a first direction;
a second conductive layer extending in a second direction intersecting the first direction;
a first variable resistance layer provided between the first conductive layer and the second conductive layer and configured to assume a first high resistance state and to assume a first low resistance state; and
a control circuit configured to:
control a voltage to be applied to the first conductive layer and to control a voltage to be applied to the second conductive layer;
apply a first voltage between the first conductive layer and the second conductive layer for a first time and apply a second voltage less than the first voltage between the first conductive layer and the second conductive layer for a second time longer than the first time after the application of the first voltage when the first variable resistance layer is in the first high resistance state;
apply the first voltage between the first conductive layer and the second conductive layer and apply a third voltage less than the second voltage between the first conductive layer and the second conductive layer after the application of the first voltage when the first variable resistance layer is in the first low resistance state; and
compare a current flowing in the second conductive layer to a reference current while the second voltage is applied, and when the current is less than the reference current, apply the first voltage between the first conductive layer and second conductive layer for the first time, and apply a fourth voltage less than the first voltage and greater than the second voltage between the first conductive layer and the second conductive layer after the application of the first voltage.

2. The storage device according to claim 1, wherein the control circuit is configured to apply the second voltage and to apply the third voltage such that a change time from the first voltage to the second voltage and a change time from the first voltage to the third voltage are equal to or shorter than about 30 nanoseconds.

3. The storage device according to claim 1, wherein the second time is equal to or longer than about 70 nanoseconds.

4. The storage device according to claim 1, wherein the first time is equal to or longer than about 10 nanoseconds.

5. The storage device according to claim 1, wherein the second voltage is equal to or greater than about one-third of a magnitude of the first voltage.

6. The storage device according to claim 1, further comprising:
a third conductive layer extending in the first direction; and
a second variable resistance layer provided between the third conductive layer and the second conductive layer and configured to assume a second high resistance state and to assume a second low resistance state,
wherein the control circuit is configured to control a voltage to be applied to the third conductive layer and to apply the first voltage between the third conductive layer and the second conductive layer while the second voltage is applied between the first conductive layer and the second conductive layer.

7. The storage device according to claim 1, wherein the first variable resistance layer comprises a chalcogenide.

8. The storage device according to claim 1, wherein the first variable resistance layer comprises at least one of germanium, antimony, or tellurium.

9. A method of controlling a storage device comprises:
providing the storage device including a first conductive layer extending in a first direction, a second conductive layer extending in a second direction intersecting the first direction, and a first variable resistance layer provided between the first conductive layer and the second conductive layer and configured to assume a first high resistance state and to assume a first low resistance state;
applying a first voltage between the first conductive layer and the second conductive layer for a first time and applying a second voltage less than the first voltage between the first conductive layer and the second conductive layer for a second time longer than the first time after the application of the first voltage when the first variable resistance layer is in the first high resistance state;
applying the first voltage between the first conductive layer and the second conductive layer and applying a third voltage less than the second voltage between the first conductive layer and the second conductive layer after the application of the first voltage when the first variable resistance layer is in the first low resistance state; and
comparing current flowing in the second conductive layer to a reference current while the second voltage is applied, and when the current is less than the reference current, further applying the first voltage between the first conductive layer and the second conductive layer for the first time and applying a fourth voltage less than the first voltage and greater than the second voltage between the First conductive layer and the second conductive after the application of the first voltage.

10. The method of controlling the storage device, according to claim 9,
wherein the second voltage and the third voltage are applied such that a change time from the first voltage to the second voltage and a change time from the first voltage to the third voltage are equal to or shorter than about 30 nanoseconds.

11. The method of controlling the storage device, according to claim 9,
wherein the second time is equal to or longer than about 70 nanoseconds.

12. The method of controlling the storage device, according to claim 9,
wherein the first time is equal to or longer than about 10 nanoseconds.

13. The method of controlling the storage device, according to claim 9,
wherein the second voltage is equal to or greater than about one-third of a magnitude of the first voltage.

14. The method of controlling the storage device, according to claim 9, wherein providing the storage device further comprises providing the storage device comprising a third conductive layer extending in the first direction and a second variable resistance layer provided between the third conductive layer and the second conductive layer and configured to assume a second high resistance state and to assume a second low resistance state, the method further comprising:
applying the first voltage between the third conductive layer and the second conductive layer while the second voltage is applied between the first conductive layer and the second conductive layer.

15. The method of controlling the storage device, according to claim 9,
wherein the first variable resistance layer comprises a chalcogenide.

16. The method of controlling the storage device, according to claim 9,
wherein the first variable resistance layer comprises at least one of germanium, antimony, or tellurium.

* * * * *